United States Patent
Yang

(10) Patent No.: US 9,786,553 B1
(45) Date of Patent: Oct. 10, 2017

(54) ADVANCED BEOL INTERCONNECT STRUCTURE CONTAINING UNIFORM AIR GAPS

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/268,001

(22) Filed: Sep. 16, 2016

(51) Int. Cl.
  *H01L 23/48* (2006.01)
  *H01L 21/768* (2006.01)
  *H01L 21/02* (2006.01)

(52) U.S. Cl.
  CPC .... *H01L 21/7682* (2013.01); *H01L 21/02329* (2013.01); *H01L 21/76831* (2013.01); *H01L 21/76843* (2013.01); *H01L 21/76855* (2013.01); *H01L 21/76865* (2013.01); *H01L 21/76867* (2013.01); *H01L 2221/1063* (2013.01)

(58) Field of Classification Search
  CPC ........... H01L 21/7682; H01L 21/02329; H01L 21/76831; H01L 21/76843; H01L 21/76855; H01L 21/76865; H01L 21/76867
  USPC ......................................................... 257/773
  See application file for complete search history.

(56) References Cited

U.S. PATENT DOCUMENTS

| | | | |
|---|---|---|---|
| 5,949,143 A | 9/1999 | Bang | |
| 6,930,034 B2 | 8/2005 | Colburn et al. | |
| 7,071,532 B2 | 7/2006 | Geffken et al. | |
| 7,285,474 B2* | 10/2007 | Anderson | H01L 21/76802 257/E21.579 |
| 7,560,375 B2* | 7/2009 | Filippi | H01L 21/76807 438/618 |
| 8,952,539 B2* | 2/2015 | Clevenger | H01L 21/02126 257/640 |
| 9,443,956 B2* | 9/2016 | Yu | H01L 29/6656 |
| 2008/0182405 A1* | 7/2008 | Liu | H01L 21/76807 438/623 |

* cited by examiner

*Primary Examiner* — Ori Nadav
(74) *Attorney, Agent, or Firm* — Scully, Scott, Murphy & Presser, P.C.; Louis J. Percello, Esq.

(57) ABSTRACT

A semiconductor structure including a back-end-of-the-line (BEOL) interconnect structure that contains an air gap located on each side of an interconnect metal or metal alloy structure, is provided wherein each air gap has a uniform (i.e., homogenous) shape. The uniform shape of the air gap can aide in reducing the electrical performance variation which is typically observed with prior art interconnect structures containing air gaps that have a non-uniform shape.

15 Claims, 10 Drawing Sheets

ADVANCED BEOL INTERCONNECT STRUCTURE CONTAINING UNIFORM AIR GAPS

BACKGROUND

The present application relates to a semiconductor structure and a method of forming the same. More particularly, the present application relates to a back-end-of-the-line (BEOL) interconnect structure that contains an air gap located on each side of an interconnect metal or metal alloy structure, wherein each air gap has a uniform shape. The present application also provides a method of forming such a semiconductor structure.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure, which may also be referred to as a BEOL interconnect structure or an interconnect metal or metal alloy structure, typically includes copper, Cu, since Cu based interconnects provide higher speed signal transmission between large numbers of transistors on a complex semiconductor chip as compared with aluminum, Al, based interconnects.

Within a typical interconnect structure, metal vias containing an interconnect metal or metal alloy run perpendicular to the semiconductor substrate and metal lines also containing an interconnect metal or metal alloy run parallel to the semiconductor substrate. Further enhancement of the signal speed and reduction of signals in adjacent metal lines (known as "crosstalk") are achieved in today's IC product chips by embedding an interconnect metal or metal alloy structure in a dielectric material having a dielectric constant of less than 4.0 (i.e., a low k dielectric material).

Interconnect structures in integrated circuits induce a delay in the propagation of the information between semiconductor devices such as transistors. To reduce this delay, the interconnect structures should possess the lowest capacitance possible. One approach to form interconnect structures with the lowest possible capacitance is to introduce air (or vacuum) gaps into the interconnect dielectric material of the interconnect structure. By replacing a portion of the dielectric material with an air gap, the capacitance can be reduced dramatically. Typically, air gaps are formed into an interconnect dielectric material by lithography and etching. In such a process, the air gap features are created using a mask and such features are formed from the top of the interconnect dielectric material downward which causes the resultant air gap to have a non-homogeneous (i.e., oval) shape. In such interconnect structures, electrical performance variation may result from the non-homogeneous shape of the air gaps.

There is thus a need for providing a back-end-of-the-line (BEOL) interconnect structure that contains an air gap located on each side of an interconnect metal or metal alloy structure, wherein each air gap has a uniform (i.e., homogenous) shape.

SUMMARY

A semiconductor structure including a back-end-of-the-line (BEOL) interconnect structure that contains an air gap located on each side of an interconnect metal or metal alloy structure is provided, wherein each air gap has a uniform (i.e., homogenous) shape. By "uniform shape" it is meant that the width, w1, of each air gap, as measured from one sidewall to another sidewall and within the entirety of the air gap, is substantially constant; thus each air gap has substantially vertical sidewalls. By "substantially constant" it is meant that the measured widths are within ±15 nm of each other. The uniform shape of the air gap can aide in reducing the electrical performance variation which is typically observed with prior art interconnect structures containing air gaps not having a uniform shape.

One aspect of the present application relates to a method of forming a semiconductor structure. In one embodiment, the method may include forming at least one opening into an interconnect dielectric material. A sacrificial liner is then formed lining sidewalls of each opening. Next, an interconnect metal or metal alloy structure is formed in the at least one opening, wherein each interconnect metal or metal alloy structure has a topmost surface that is coplanar with a topmost surface of the interconnect dielectric material. Each sacrificial liner is then removed to provide a cavity. A width of each cavity is then widened to provide an air gap feature having a uniform shape. A air gap cap layer is then formed sealing the air gap features and providing air gaps also having the uniform shape.

Another aspect of the present application relates to a semiconductor structure. In one embodiment of the present application, the semiconductor structure includes at least one interconnect metal or metal alloy structure embedded in an interconnect dielectric material. An air gap having a uniform shape is present in the interconnect dielectric material and on each side of the at least one interconnect metal or metal alloy structure.

DETAILED DESCRIPTION

Figure 1:
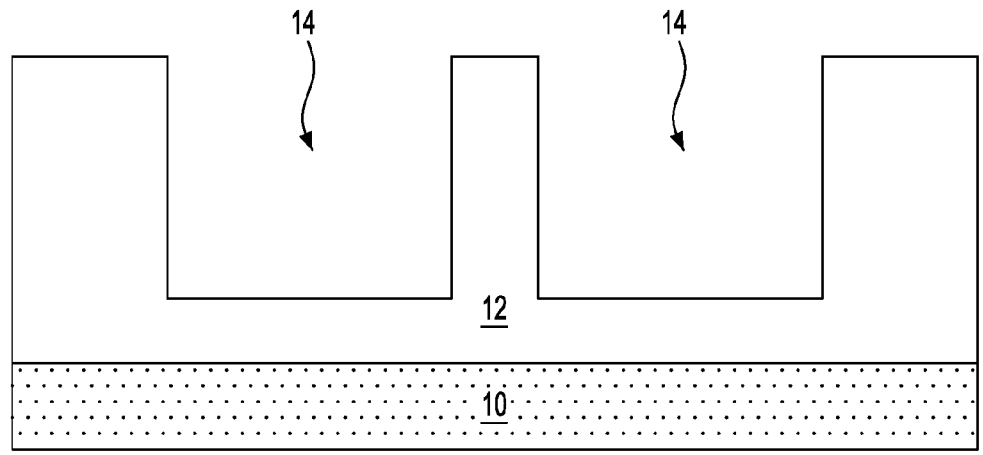
FIG. 1 is a cross sectional view of an exemplary semiconductor structure including at least one opening present in an interconnect dielectric material that is located on a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. As is illustrated in FIG. 1, the exemplary semiconductor structure includes an interconnect dielectric material 12 that is located on a surface of a substrate 10. At least one opening 14 is located within the interconnect dielectric material 12. In the drawings, two openings 14 are shown by way of one example. The number of openings 14 that are present within the interconnect dielectric material 12 may vary so long as at least one opening 14 is formed therein.

The substrate 10 may be composed of a semiconductor material, an insulator material, a conductive material or any combination thereof. When the substrate is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, the substrate 10 can be a layered semiconductor such as, for example, Si/SiGe, Si/SiC, silicon-on-insulators (SOIs) or silicon germanium-on-insulators (SGOIs).

When the substrate 10 is an insulator material, the insulator material can be an organic insulator, an inorganic insulator or any combination thereof including multilayers. When the substrate 10 is a conductive material, the substrate 10 may include, for example, polySi, an elemental metal, alloys of elemental metals, a metal silicide, a metal nitride or any combination thereof including multilayers. When the substrate 10 is composed of a semiconductor material, one or more semiconductor devices such as, for example, complementary metal oxide semiconductor (CMOS) devices can be fabricated thereon. When the substrate 10 is composed of a combination of an insulating material and a conductive material, the substrate may represent an underlying interconnect level of a multilayered interconnect structure.

The interconnect dielectric material 12 that is employed may be composed of any interlevel or intralevel dielectric including inorganic dielectrics or organic dielectrics. In one embodiment, the interconnect dielectric material 12 may be non-porous. In another embodiment, the interconnect dielectric material 12 may be porous. Some examples of suitable dielectrics that can be used as the interconnect dielectric material 12 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material 12 may vary depending upon the type of dielectric material(s) used. In one example, the interconnect dielectric material 12 may have a thickness from 50 nm to 1000 nm. Other thicknesses that are lesser than, or greater than, the aforementioned thickness range may also be employed in the present application for the thickness of the interconnect dielectric material 12.

The at least one opening 14 that is formed into the interconnect dielectric material 12 can be formed utilizing a patterning process. In one embodiment, the patterning process may include lithography and etching. The lithographic process includes forming a photoresist (not shown) atop the interconnect dielectric material 12, exposing the photoresist to a desired pattern of radiation and developing the exposed photoresist utilizing a conventional resist developer. The photoresist may be a positive-tone photoresist, a negative-tone photoresist or a hybrid-tone photoresist, and can be applied utilizing a deposition process such as, for example, spin-on coating. In some embodiments, a hard mask such as, for example, a layer of silicon dioxide and/or silicon nitride, can be interposed between the photoresist and the interconnect dielectric material 12. The etching process includes a dry etching process (such as, for example, reactive ion etching, ion beam etching, plasma etching or laser ablation), and/or a wet chemical etching process. Typically, reactive ion etching is used in providing the at least one opening into at least the interconnect dielectric material 12. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying interconnect dielectric material 12.

The depth of the at least one opening 14 that is formed into the interconnect dielectric material 12 (measured from the topmost surface of the interconnect dielectric material 12 to the bottom wall of the at least one opening) may vary. The at least one opening 14 typically stops within the interconnect dielectric material 12 itself. In some embodiments, the depth of each opening 14 is the same. In yet further embodiments, different depth openings (not shown) can be formed into the interconnect dielectric material 12.

The at least one opening 14 that is formed into the interconnect dielectric material 12 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, each opening 14 is shown as a line opening. When a via or line opening is formed, a single damascene process (including the above mentioned lithography and etching steps) can be employed. When a combined via/line is formed a dual damascene process (including at least one iteration of the above mentioned lithography and etching steps) can be employed.

Figure 2:
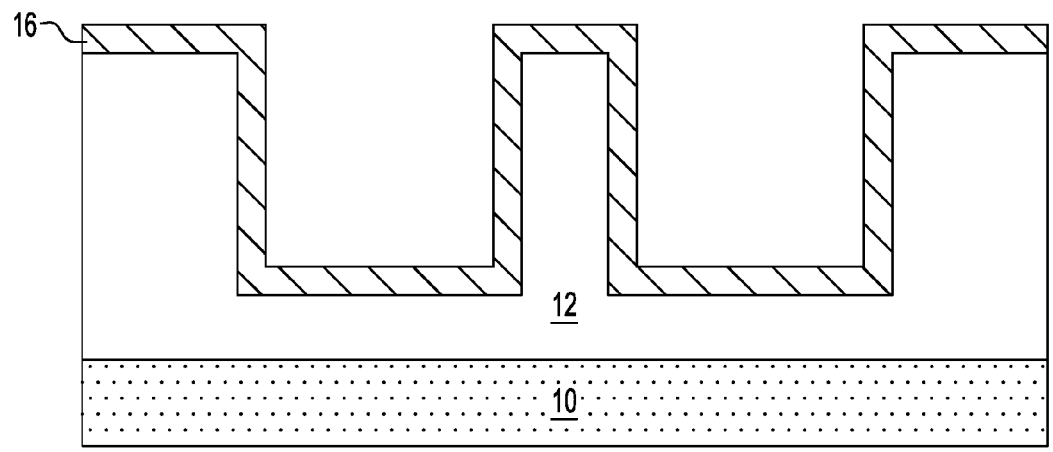
FIG. 2 is a cross sectional view of the exemplary semiconductor structure of FIG. 1 after performing a nitridation process to provide a continuous nitridized dielectric surface layer.

Referring now to FIG. 2, there is illustrated the exemplary semiconductor structure of FIG. 1 after performing a nitridation process to provide a continuous nitridized dielectric surface layer 16. By "continuous" it is meant that the nitridized dielectric surface layer 16 contains no voids or breaks therein. The continuous nitridized dielectric surface layer 16 is formed into exposed surface portions of the interconnect dielectric material 12 shown in FIG. 1.

The continuous nitridized dielectric surface layer 16 comprises a same dielectric material as the interconnect dielectric material 12 with added nitrogen. The nitridation process may also be referred to herein as a nitride surface treatment process. The continuous nitridized dielectric surface layer 16 may also be referred to herein as a nitrogen enriched dielectric surface layer. By "nitrogen enriched dielectric surface layer", it is meant that the nitrided surface portions of the interconnect dielectric material 12 have a higher nitrogen content therein after performing the nitridation process as compared to the originally deposited interconnect dielectric material 12.

In one embodiment, the nitridation process used in forming the continuous nitridized dielectric surface layer 16 is a thermal nitridation process. When a thermal nitridation process is employed, no damage to the interconnect dielectric material 12 is observed. The thermal nitridation process that is employed in the present application does not include an electrical bias higher than 200 W. In some embodiments, no electrical bias is performed during the thermal nitridation process. The thermal nitridation process employed in the present application is performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient.

Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical. In one embodiment, the thermal nitridation process employed in the present application is performed at a temperature from 50° C. to 450° C. In another embodiment, the thermal nitridation process employed in the present application is performed at a temperature from 100° C. to 300° C.

In addition to a thermal nitridation process, the formation of the continuous nitridized dielectric surface layer 16 can include a plasma nitridation process. When a plasma nitridation process is employed, an electrical bias of greater than 200 W can be employed. The plasma nitridation process is performed by generating a plasma from one of the nitrogen-containing ambients that is mentioned above for the thermal nitridation process. In one embodiment, the plasma nitridation process employed in the present application is performed at a temperature from 50° C. to 450° C. In another embodiment, the plasma nitridation process employed in the present application is performed at a temperature from 100° C. to 300° C.

Notwithstanding the type of nitridation employed, the depth of the continuous nitridized dielectric surface layer 16 may vary. Typically, the depth of the continuous nitridized dielectric surface layer 16, as measured from the exposed surface of the interconnect dielectric material 12 inward, is from 0.5 nm to 20 nm, with a depth from 1 nm to 10 nm being more typical.

As mentioned above, the continuous nitridized dielectric surface layer 16 is composed of a same dielectric material as the interconnect dielectric material 12 with added nitrogen. In some embodiments, the nitrogen content (which is a combination of added nitrogen plus any nitrogen that may be present in the interconnect dielectric material 12) of the continuous nitridized dielectric surface layer 16 is 10 atomic percent or greater. In one embodiment of the present application, the nitrogen content of the continuous nitridized dielectric surface layer 16 can be from 10 atomic percent nitrogen to 50 atomic percent nitrogen. Nitrogen contents of less than 10 atomic percent are also contemplated. The thickness of the continuous nitridized dielectric surface layer 16 is the same as the depth mentioned above. That is, the continuous nitridized dielectric surface layer 16 may, for example, have a thickness from 0.5 nm to 20 nm.

Figure 3:
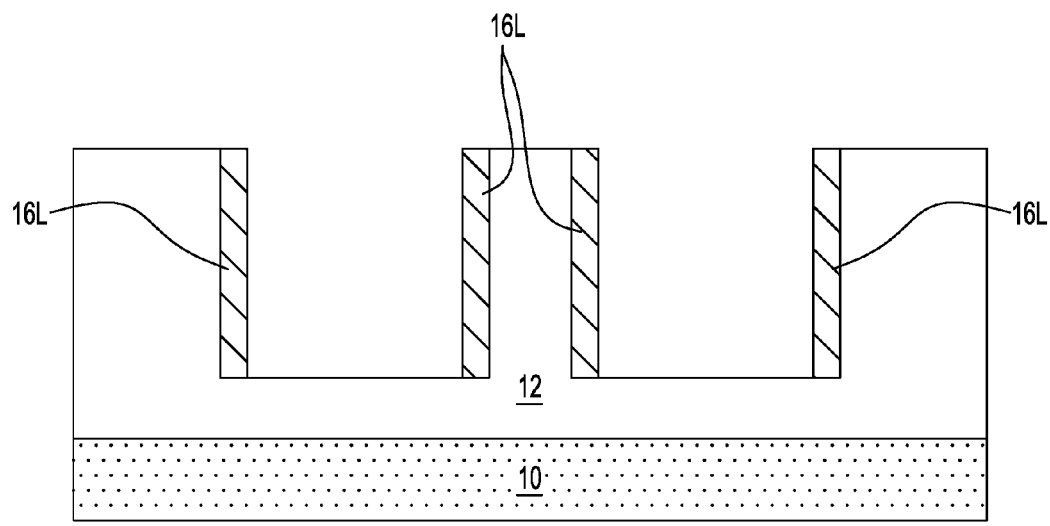
FIG. 3 is a cross sectional view of the exemplary semiconductor structure of FIG. 2 after removing the nitridized dielectric surface layer from the horizontal surfaces of the interconnect dielectric material, while maintaining the nitridized dielectric surface layer on vertical surfaces of the interconnect dielectric material.

Referring now to FIG. 3, there is illustrated the exemplary semiconductor structure of FIG. 2 after removing the nitridized dielectric surface layer 16 from the horizontal surfaces of the interconnect dielectric material 12, while maintaining the nitridized dielectric surface layer 16 on vertical surfaces of the interconnect dielectric material 12. The remaining portions of the nitridized dielectric surface layer 16 may be referred to herein as a nitridized dielectric surface liner 16L.

Each nitridized dielectric surface liner 16L can be formed utilizing a directional etching process such as a sputter etch. In one example, the sputter etch may include a hydrogen containing plasma. As is shown, each nitridized dielectric surface liner 16L has a topmost surface that is coplanar with a topmost surface of the interconnect dielectric material 12 that remains after performing the nitridization process. As is further shown, each nitridized dielectric surface liner 16L is present only along vertical sidewalls of the interconnect dielectric material 12 that are present in each opening 14.

Figure 4:
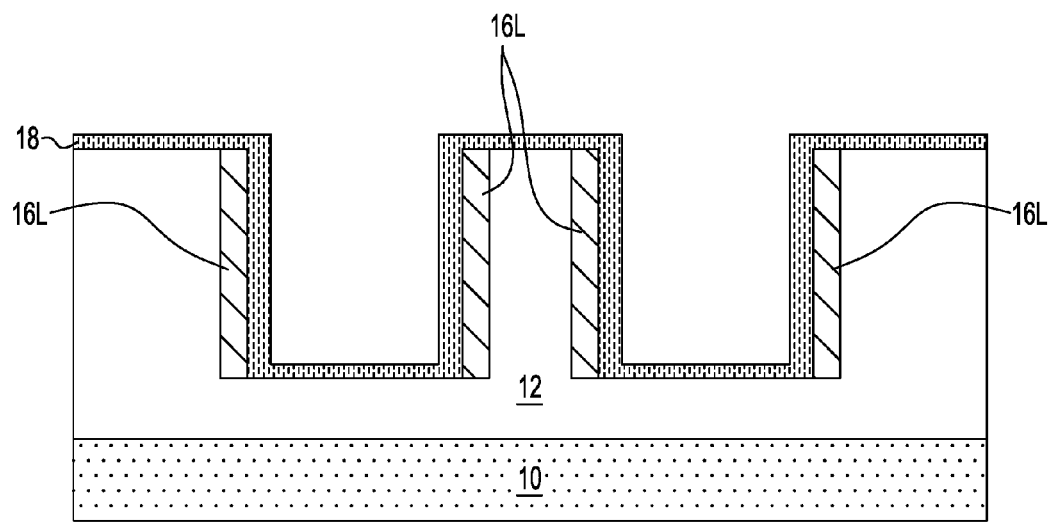
FIG. 4 is a cross sectional view of the exemplary semiconductor structure of FIG. 3 after forming a metal layer.

Referring now to FIG. 4, there is illustrated the exemplary semiconductor structure of FIG. 3 after forming a metal layer 18. The metal layer 18 is a continuous layer that is formed on the exposed surfaces of the interconnect dielectric material 12 as well as along the exposed sidewalls and topmost surface of each nitridized dielectric surface liner 16L.

The metal layer 18 may include Ti, Rh, Al, Ta, Co, Ru, Jr, W, Ru, Ni or nitrides of any of the aforementioned elemental metals. The metal layer 18 may be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The metal layer 18 may have a thickness of from 2 nm to 50 nm; although other thicknesses are contemplated and can be employed in the present application.

Figure 5:
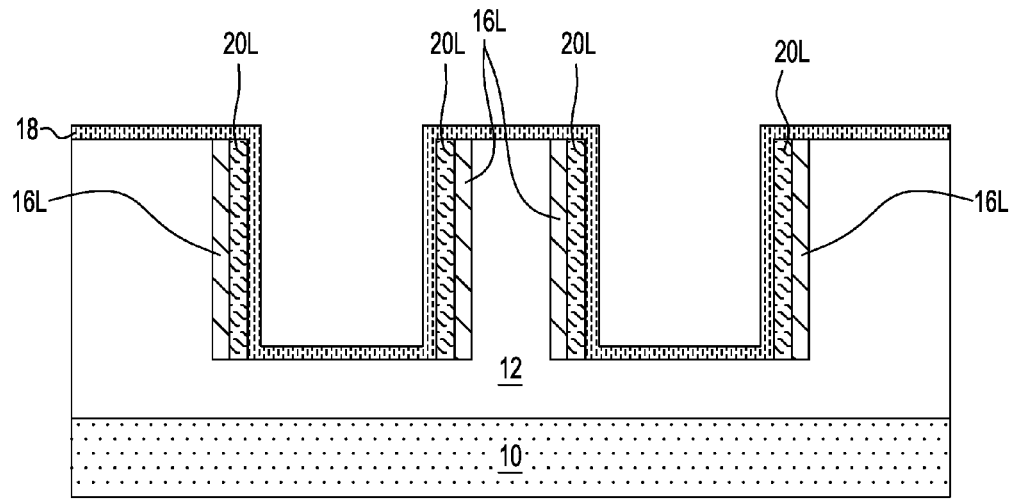
FIG. 5 is a cross sectional view of the exemplary semiconductor structure of FIG. 4 after forming a metal nitride liner between the nitridized dielectric surface layer that is present on vertical surfaces of the interconnect dielectric material and the metal layer.

Referring now to FIG. 5, there is illustrated the exemplary semiconductor structure of FIG. 4 after forming a metal nitride liner 20L between the nitridized dielectric surface layer 16L that is present on vertical surfaces of the interconnect dielectric material 12 and the metal layer 18; the metal nitride liner 20L is a sacrificial material that is removed in a subsequent processing step of the present application. The metal nitride liner 20L is formed by annealing the exemplary semiconductor structure shown in FIG. 4 to cause an in-situ reaction between the nitridized dielectric surface layer 16L that is present on vertical surfaces of the interconnect dielectric material 12 and the metal layer 18. During this reaction, a portion of the nitridized dielectric surface layer 16L and a portion of the metal layer 18 are reacted to form the metal nitride liner 20L. Thus, the nitridized dielectric surface layer 16L and the metal layer 18 at the nitridized dielectric surface layer 16L/metal layer 18 interface are at least partially consumed. In some embodiments, portions of the nitridized dielectric surface layer 16L and the metal layer 18 may remain as shown in FIG. 5. In other embodiments, the entirety of the nitridized dielectric surface layer 16L and/or the metal layer 18 at the nitridized dielectric surface layer 16L/metal layer 18 interface are consumed.

In one embodiment, the annealing is a thermal anneal. The thermal anneal may be performed at a temperature of from 100° C. to 250° C. In one embodiment, the thermal anneal is performed in an inert gas ambient (i.e., at least one of Ar, Ne, and Xe). In another embodiment, the thermal anneal is performed in a forming gas ambient. The duration of the thermal anneal used in forming the metal nitride liner 20L can vary. In one example, and within the anneal temperature range mentioned above, the duration of the thermal anneal used in forming the metal nitride liner 20L can be from 10 minutes to 2 hours. The thermal anneal may include a rapid thermal anneal, a furnace anneal or a laser anneal.

Figure 6:
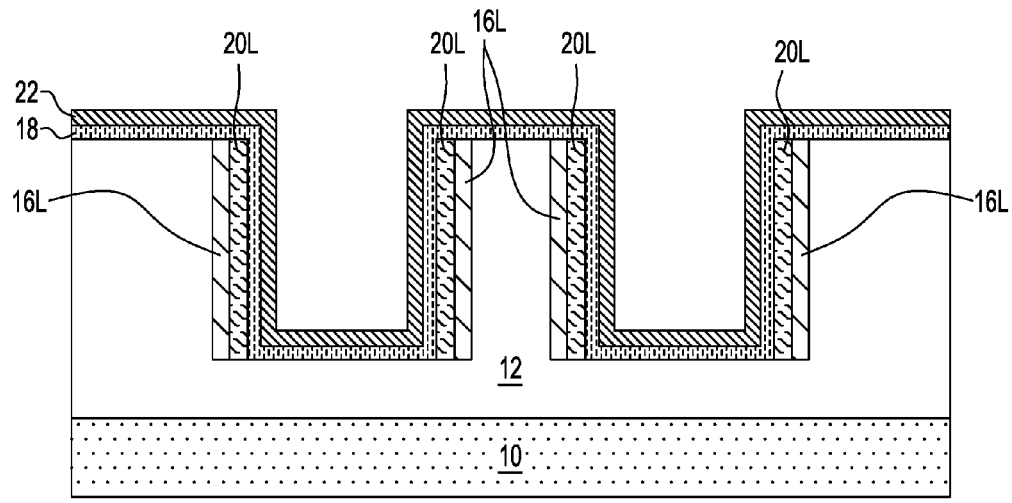
FIG. 6 is a cross sectional view of the exemplary semiconductor structure of FIG. 5 after forming a continuous diffusion barrier material layer.

Referring now to FIG. 6, there is illustrated the exemplary semiconductor structure of FIG. 5 after forming a continuous diffusion barrier material layer 22. In some embodiments of the present application, the formation of the continuous diffusion barrier material layer 22 can be omitted.

The continuous diffusion barrier material layer 22 may be composed of Ta, TaN, Ti, TiN, Ru, RuN, RuTa, RuTaN, W, WN or any other material that can serve as a barrier to prevent a conductive material from diffusing there through. The continuous diffusion barrier material layer 22 may be composed of a same material as, or a different material from, the metal layer 18. The thickness of the continuous diffusion barrier material layer 22 may vary depending on the deposition process used as well as the material employed. In some embodiments, the continuous diffusion barrier material layer 22 may have a thickness from 2 nm to 50 nm; although other thicknesses for the continuous diffusion barrier material layer 22 are contemplated and can be employed in the present application. The continuous diffusion barrier material layer 22 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed within each opening. The optional plating seed layer is employed to selectively promote subsequent electroplating of a pre-selected conductive metal or metal alloy. The optional plating seed layer may be composed of Cu, a Cu alloy, Jr, an Jr alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Figure 7:
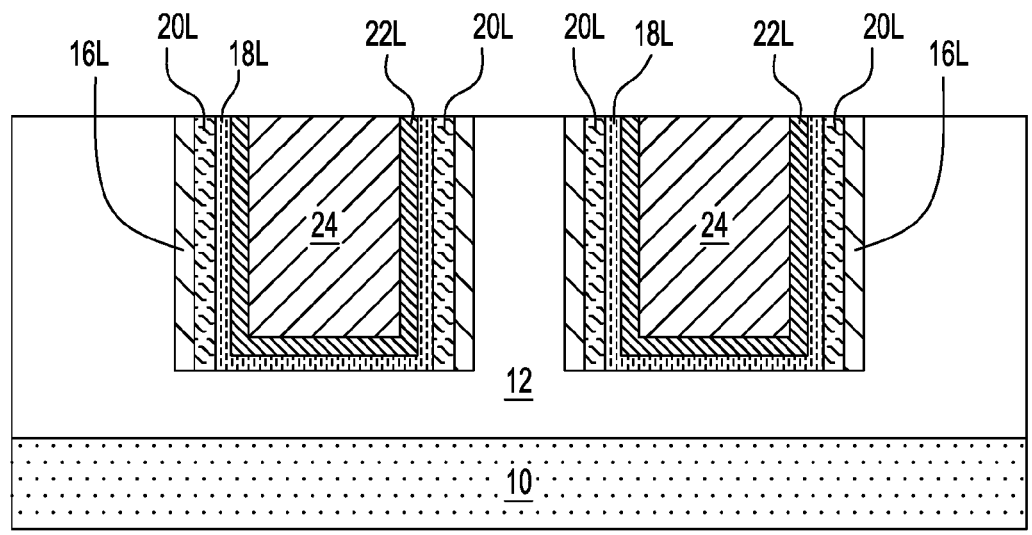
FIG. 7 is a cross sectional view of the exemplary semiconductor structure of FIG. 6 after forming an interconnect metal or metal alloy and performing a planarization process to form an embedded interconnect metal or metal alloy structure.

Referring now to FIG. 7, there is illustrated the exemplary semiconductor structure of FIG. 6 after forming an interconnect metal or metal alloy and performing a planarization process to form an embedded interconnect metal or metal alloy structure 24 with each opening 14.

The interconnect metal or metal alloy that can be employed may include Cu, W, Al or alloys thereof such as, for example, a copper aluminum (Cu-Al) alloy or an aluminum copper (Al—Cu) alloy. The interconnect metal or metal alloy may be formed by a deposition process including chemical vapor deposition (CVD), plasma enhanced chemical vapor deposition (PECVD), sputtering, chemical solution deposition or plating. In one example, a bottom-up plating process may be used in forming the interconnect metal or metal alloy.

Following the deposition of the interconnect metal or metal alloy, a planarization process such as, for example, chemical mechanical polishing (CMP) and/or grinding, can be used to provide the exemplary semiconductor structure shown in FIG. 7. The planarization process is a material removal process that removes all materials that are present outside the at least one opening 14 and above the topmost surface of the interconnect dielectric material 12. For example, the planarization removes portions of the interconnect metal or metal alloy, portions of the continuous diffusion barrier material layer 22 and portions of the metal layer 18 that are located outside each opening 14 and above the topmost surface of the interconnect dielectric material 12. Portions of each of the interconnect metal or metal alloy, the continuous diffusion barrier material layer 22 and the metal layer 18 may remain inside each opening 14. Each remaining portion of the interconnect metal or metal alloy is referred to as the interconnect metal or metal alloy structure 24, each remaining portion of the continuous diffusion barrier material layer 22 is referred as diffusion barrier liner 22L and each remaining portion of the metal layer 18 is referred to herein as a metal liner 18L. The metal liner 18L and the diffusion barrier liner 22L are both U-shaped. By "U-shaped" it is meant a material that has a horizontal bottom portion a vertical portion extending from each end of the horizontal portion.

As is shown, each embedded interconnect metal or metal alloy structure 24 has a topmost surface that is coplanar with a topmost surface of the interconnect dielectric material 12. As is further shown, the topmost surfaces of the surface nitridized dielectric surface liner 16L, the metal nitride liner 20L, the metal liner 18L, and the diffusion barrier liner 22L are coplanar with each as well being coplanar with the topmost surfaces of each interconnect metal or metal alloy structure 24 and the interconnect dielectric material 12.

Figure 8:
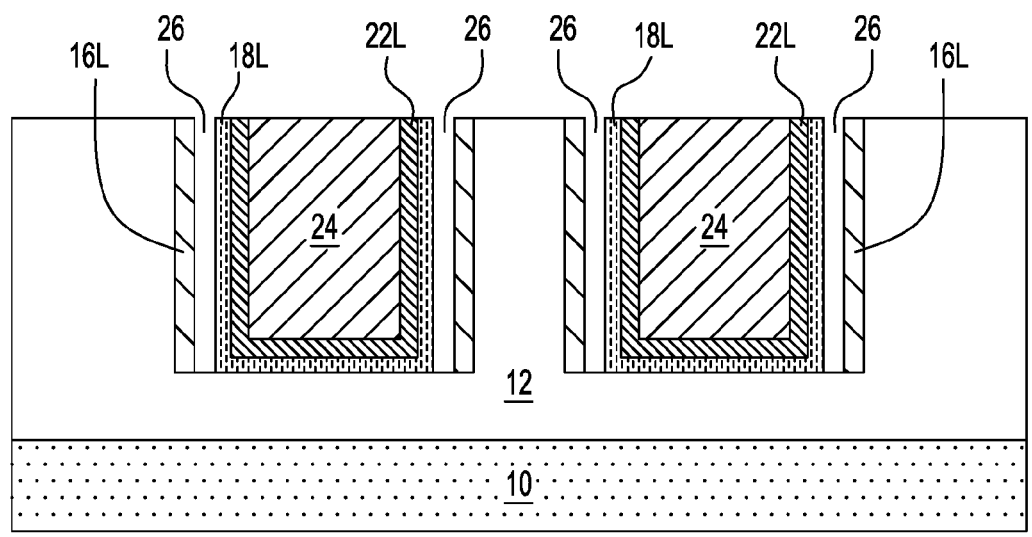
FIG. 8 is a cross sectional view of the exemplary semiconductor structure of FIG. 7 after removing the metal nitride liner to create a cavity on each side of the interconnect metal or metal alloy structure.

Referring now to FIG. 8, there is illustrated the exemplary semiconductor structure of FIG. 7 after removing the metal nitride liner 20L to create a cavity 26 on each side of the interconnect metal or metal alloy structure 24. The metal nitride liner 20L may be removed utilizing an etching process such as a wet chemical etchant that is selective in removing metal nitride. In one example, and when the metal nitride liner 20L is composed of TiN, HF, $H_2SO_4$, HCl, $H_3NO_4$ or $H_2O_2$ may be used as a chemical etchant.

Figure 9:
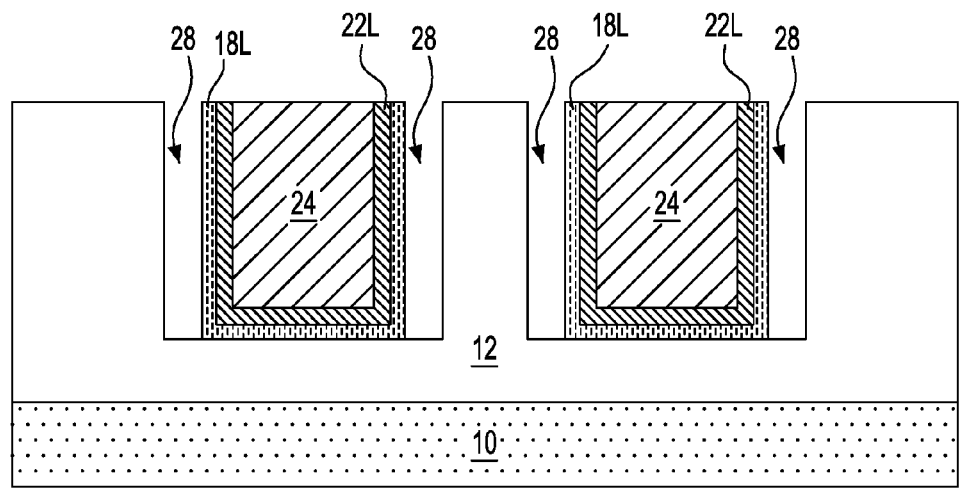
FIG. 9 is a cross sectional view of the exemplary semiconductor structure of FIG. 8 after widening the width of each cavity to create an air gap feature having a uniform shape on each side of the interconnect metal or metal alloy structure.

Referring now to FIG. 9, there is illustrated the exemplary semiconductor structure of FIG. 8 after widening the width of each cavity 26 to create an air gap feature 28 on each side of the interconnect metal or metal alloy structure 24. The widening of the width of each cavity 26 may include removing the surface nitridized dielectric surface liner 16L and adjacent portion of the interconnect dielectric material 12. The removal may include a plasma etch to damage the dielectric and a wet chemical etchant to remove the damaged surface nitridized dielectric surface liner 16L and adjacent damaged portion of the interconnect dielectric material 12. Each air gap feature 28 that is provided has a uniform shape as defined below for the air gaps.

Figure 10:
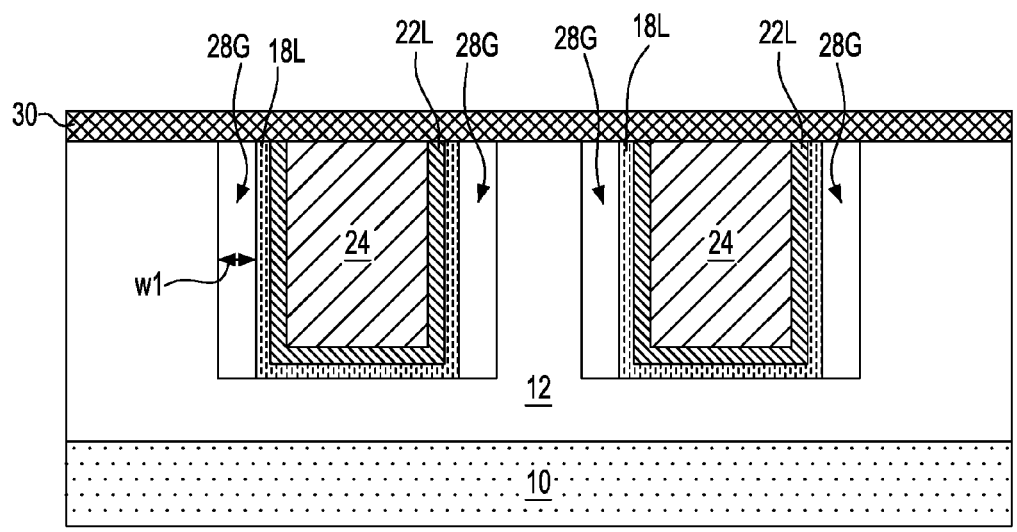
FIG. 10 is a cross sectional view of the exemplary semiconductor structure of FIG. 9 after forming an air gap cap layer that seals the air gap features and provides air gaps having the uniform shape.

Referring now to FIG. 10, there is illustrated the exemplary semiconductor structure of FIG. 9 after forming an air gap cap layer 30 which seals each air gap feature 28 forming air gaps 28G. Each air gap 28G has a uniform shape. By "uniform shape" it is meant that the width, w1, of each air gap 28G, as measured from one sidewall to another sidewall and within the entirety of the air gap, is substantially constant; thus each air gap 28G has substantially vertical sidewalls. By "substantially constant" it is meant that the measured widths are within ±15 nm of each other. In one embodiment, each air gap 28G has a topmost surface that is coplanar with a topmost surface of the at least one interconnect metal or metal alloy structure 24. In other embodiments and when a portion of the air gap cap layer extends into the air gap feature, each air gap 28G has a topmost surface that is located beneath a topmost surface of the at least one interconnect metal or metal alloy structure 24. Each air gap 28G has a width, w1, from 1 nm to 80 nm.

The air gap cap layer 30 may include any dielectric material such as, for example, silicon carbide, silicon nitride, silicon dioxide, a carbon doped oxide, a nitrogen and hydrogen doped silicon carbide SiC(N,H) or multilayers thereof. The air gap cap layer 30 can be formed utilizing a conventional deposition process such as, for example, chemical vapor deposition, plasma enhanced chemical vapor deposition, chemical solution deposition, evaporation, or atomic layer deposition. The thickness of the air gap cap layer 30 may vary depending on the technique used to form the same as well as the material make-up of the layer. Typically, the air gap cap layer 30 has a thickness from 15 nm to 100 nm. Other thicknesses that are lesser than, or greater than the aforementioned thickness range may also be employed as the thickness of air gap cap layer 30.

Figure 11:
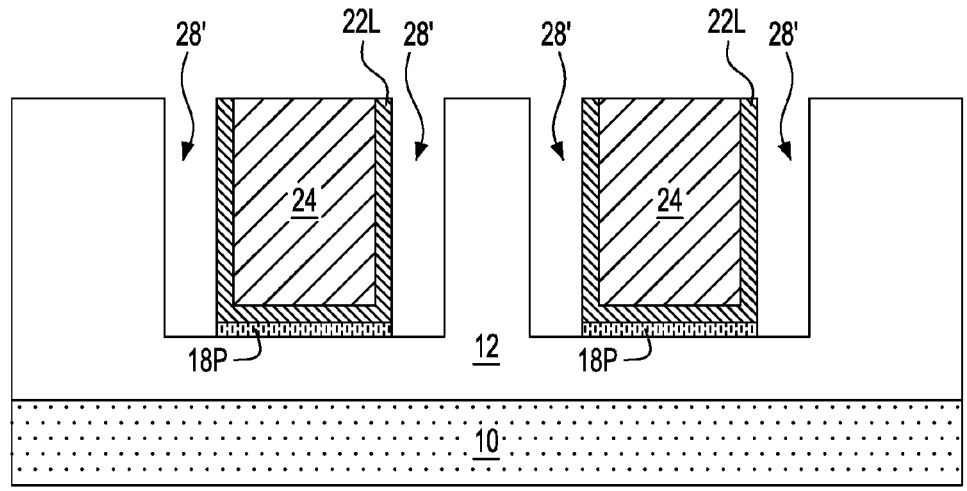
FIG. 11 is a cross sectional view of the exemplary semiconductor structure of FIG. 8 after widening the width of each cavity to create an air gap feature having a uniform shape on each side of the interconnect metal or metal alloy structure in accordance with another embodiment of the present application.

Referring now to FIG. 11, there is illustrated the exemplary semiconductor structure of FIG. 8 after widening the width of each cavity 26 to create an air gap feature 28' on each side of the interconnect metal or metal alloy structure 26 in accordance with another embodiment of the present application. In this embodiment of the present application, the widening includes removing the surface nitridized dielectric surface liner 16L and adjacent portion of the interconnect dielectric material 12 utilizing a plasma etch as described above in forming the structure shown in FIG. 9 followed by utilizing an etch to remove the vertical portions of the metal liner 18L; the remaining horizontal portion of the metal liner 18L is labeled as 18P (i.e., horizontal metal portion 18P) in FIG. 11. Each air gap feature 28' that is provided has a uniform shape.

Figure 12:
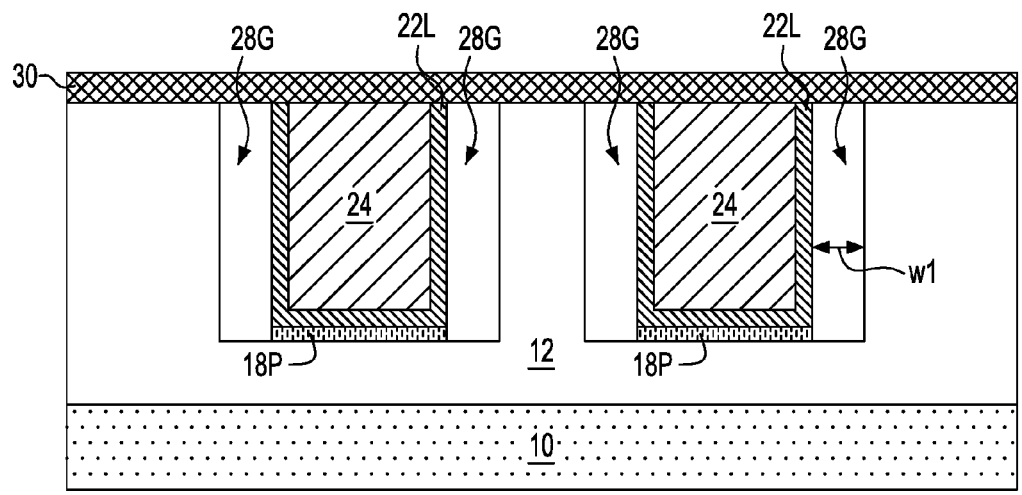
FIG. 12 is a cross sectional view of the exemplary semiconductor structure of FIG. 11 after forming an air gap cap layer that seals the air gap features and provides air gaps having the uniform shape.

Referring now to FIG. 12, there is illustrated the exemplary semiconductor structure of FIG. 11 after forming an air gap cap layer 30 which seals each air gap feature 28' forming air gaps 28G. Each air gap 28G has a uniform shape. The air gap cap layer 30 employed in this embodiment includes one of the dielectric materials mentioned above in forming air gap cap layer 30 of the previous embodiment of the present application. The air gap cap layer 30 employed in this embodiment can be formed utilizing one of the deposition processes mentioned above for forming the air gap cap layer 30 of the previous embodiment of the present application. The air gap cap layer 30 employed in this embodiment may have a thickness as described above for the air gap cap layer 30 of the previous embodiment of the present application.

Figure 13:
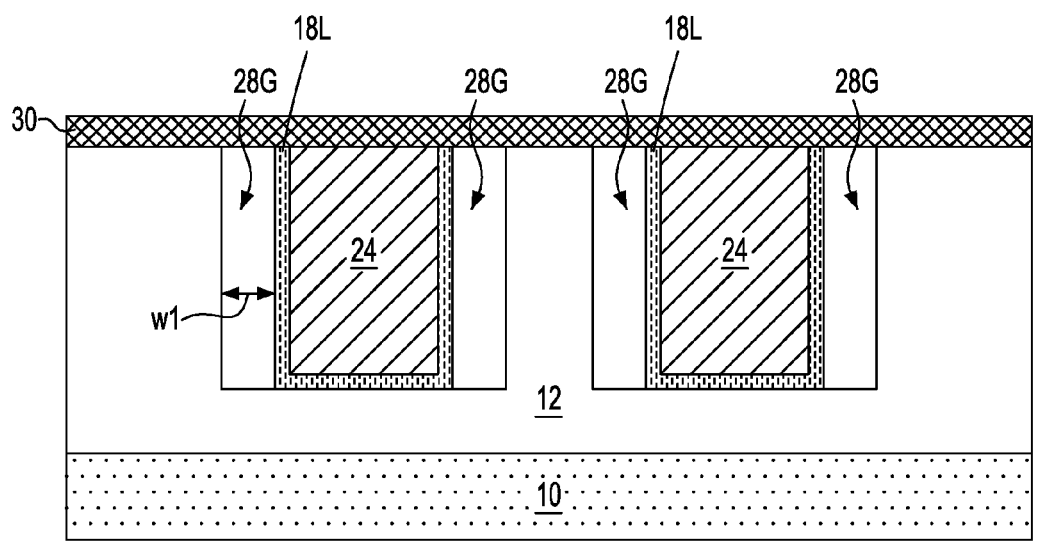
FIG. 13 is a cross sectional view of another exemplary semiconductor structure that can be formed without the need of forming a continuous diffusion barrier material layer.

Referring now to FIG. 13, there is illustrated another exemplary semiconductor structure that can be formed using the method described above without the need of forming a continuous diffusion barrier material layer 22. Like the previous embodiments of the present application, each air gap 28G has a uniform shape.

Figure 14:
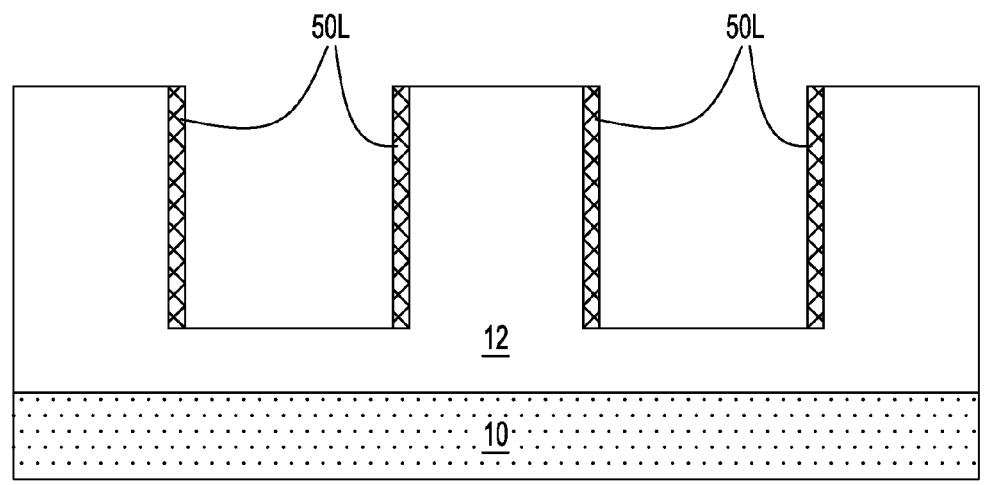
FIG. 14 is a cross sectional view of the exemplary semiconductor structure of FIG. 1 after forming a sacrificial liner on the vertical sidewalls of the interconnect dielectric material.

Referring now to FIG. 14, there is illustrated the exemplary semiconductor structure of FIG. 1 after forming a sacrificial liner 50L on the vertical sidewalls of the interconnect dielectric material 12 and within each opening 14. The sacrificial liner 50L may include any sacrificial material that can be etched selective to at least the interconnect dielectric material 12, the subsequently formed continuous diffusion barrier material layer and the subsequently formed interconnect metal or metal alloy. In one embodiment, the sacrificial material that provides the sacrificial liner 50L may include a metal nitride such as, TiN, TaN, or WN. When metal nitrides are used as the sacrificial material that provides the sacrificial liner 50L, the metal nitride must be different from the material that provides the continuous diffusion barrier material layer which is subsequently formed into each opening. In another embodiment, the sacrificial material that provides the sacrificial liner 50L may be composed of a dielectric material including atoms of Si, O and H. When such dielectric materials are used as the sacrificial material that provides the sacrificial liner 50L, the dielectric material must be different from the material that provides the interconnect dielectric material 12.

The sacrificial liner 50L may be formed by deposition of a sacrificial material, followed by performing a directional etching process such as a sputter etch. As is shown, the sacrificial liner 50L has a topmost surface that is coplanar with a topmost surface of the interconnect dielectric material 12 and the sacrificial liner 50L lines the entirety of the sidewalls within each opening 14.

Figure 15:
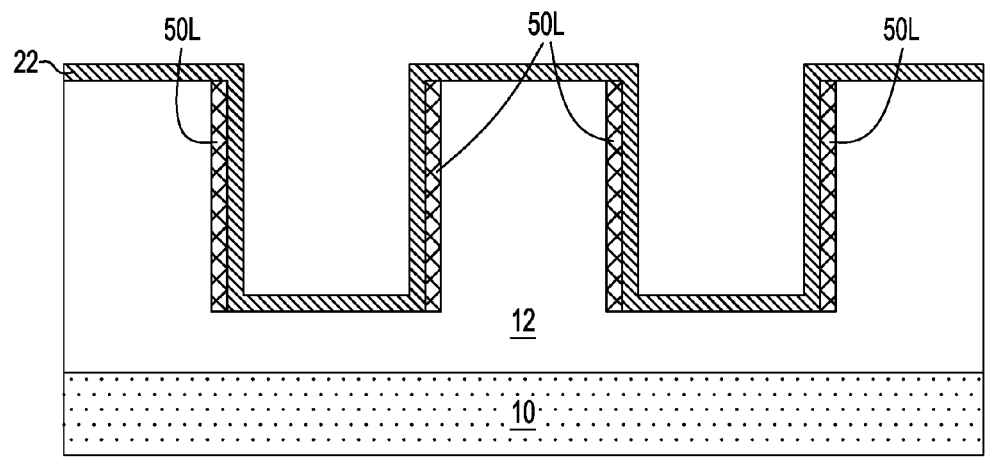
FIG. 15 is a cross sectional view of the exemplary semiconductor structure of FIG. 14 after forming a continuous diffusion barrier material layer.

Referring now to FIG. 15, there is illustrated the exemplary semiconductor structure of FIG. 14 after forming a continuous diffusion barrier material layer 22. The continuous diffusion barrier material layer 22 of this embodiment is the same as the continuous diffusion barrier material layer mentioned above for FIG. 6. In some embodiments, the formation of the continuation diffusion barrier material layer 22 is omitted. Thus, the description with regard to the continuous diffusion barrier material layer mentioned above in FIG. 6 applies equally well here for this embodiment of the present application. In some embodiments (not shown), a plating seed layer can be formed within each opening 14 prior to forming the interconnect metal or metal alloy.

Figure 16:
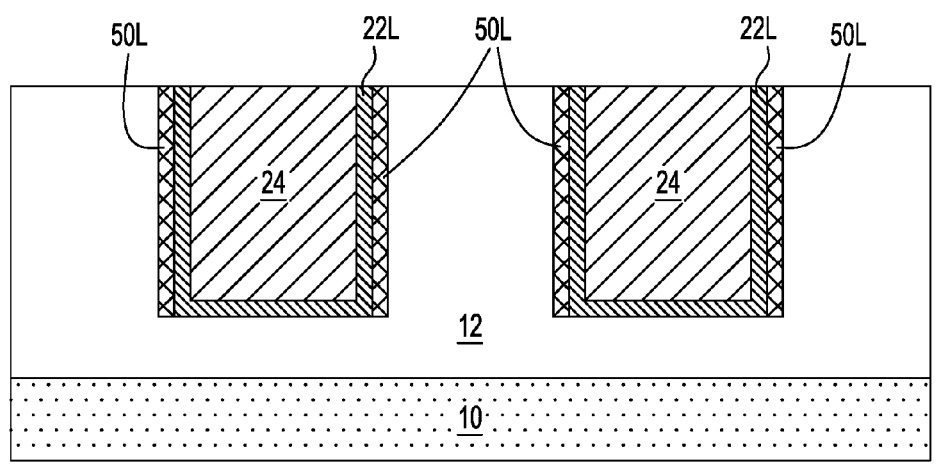
FIG. 16 is a cross sectional view of the exemplary semiconductor structure of FIG. 15 after forming an interconnect metal or metal alloy and performing a planarization process to form an embedded interconnect metal or metal alloy structure.

Referring now to FIG. 16, there is illustrated the exemplary semiconductor structure of FIG. 15 after forming an interconnect metal or metal alloy and performing a planarization process to form an embedded interconnect metal or metal alloy structure 24. The interconnect metal or metal alloy structure 24 of this embodiment is the same as the interconnect metal or metal alloy structure mentioned above for FIG. 7. Thus, the description with regard to the interconnect metal or metal alloy structure mentioned above in FIG. 7 applies equally well here for this embodiment of the present application. As is shown and in some embodiments, a U-shaped diffusion barrier liner 22L remains in each opening 14.

Figure 17:
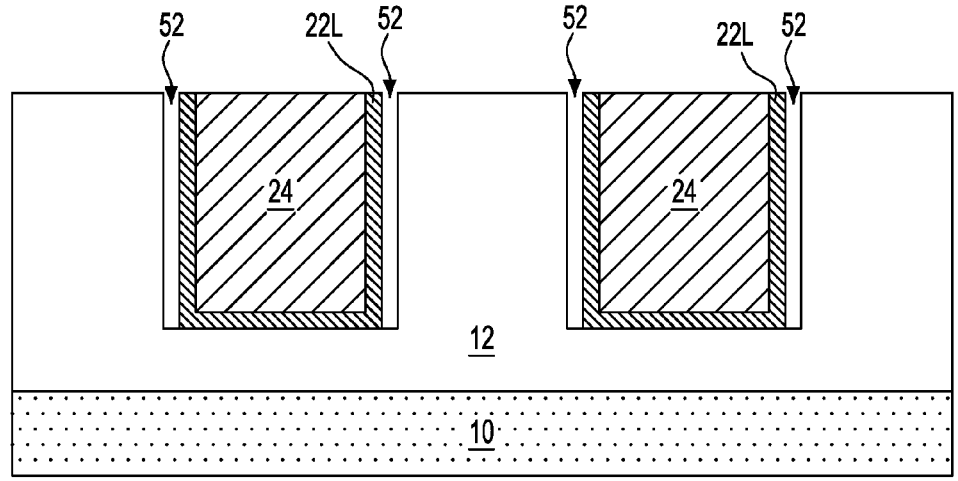
FIG. 17 is a cross sectional view of the exemplary semiconductor structure of FIG. 16 after removing the sacrificial liner to create a cavity on each side of the interconnect metal or metal alloy structure.

Referring now to FIG. 17, there is illustrated the exemplary semiconductor structure of FIG. 16 after removing the sacrificial liner 50L to create a cavity 52 on each side of the interconnect metal or metal alloy structure 24. The sacrificial liner 50L may be removed utilizing any etch that is selective in removing the material that provides the sacrificial liner 50L. In one example, and when the sacrificial liner 50L is composed of TiN, HF, $H_2SO_4$, HCl, $H_3NO_4$ or $H_2O_2$ can be used to selectively remove the sacrificial liner 50L from the exemplary semiconductor structure.

Figure 18:
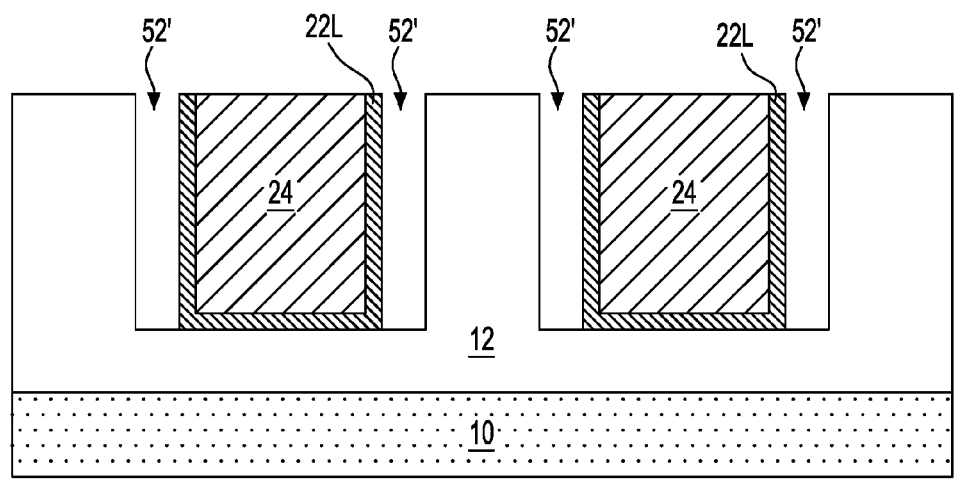
FIG. 18 is a cross sectional view of the exemplary semiconductor structure of FIG. 17 after widening the width of each cavity to create an air gap feature having a uniform shape on each side of the interconnect metal or metal alloy structure.

Referring now to FIG. 18, there is illustrated the exemplary semiconductor structure of FIG. 17 after widening the width of each cavity 52 to create an air gap feature 52' on each side of the interconnect metal or metal alloy structure 24. The widening of the width of each cavity 52 to create air gap features 52' includes the same technique as mentioned above for forming air gap features 28 shown in FIG. 9 of the present application. Each air gap feature 52' has a uniform shape.

Figure 19:
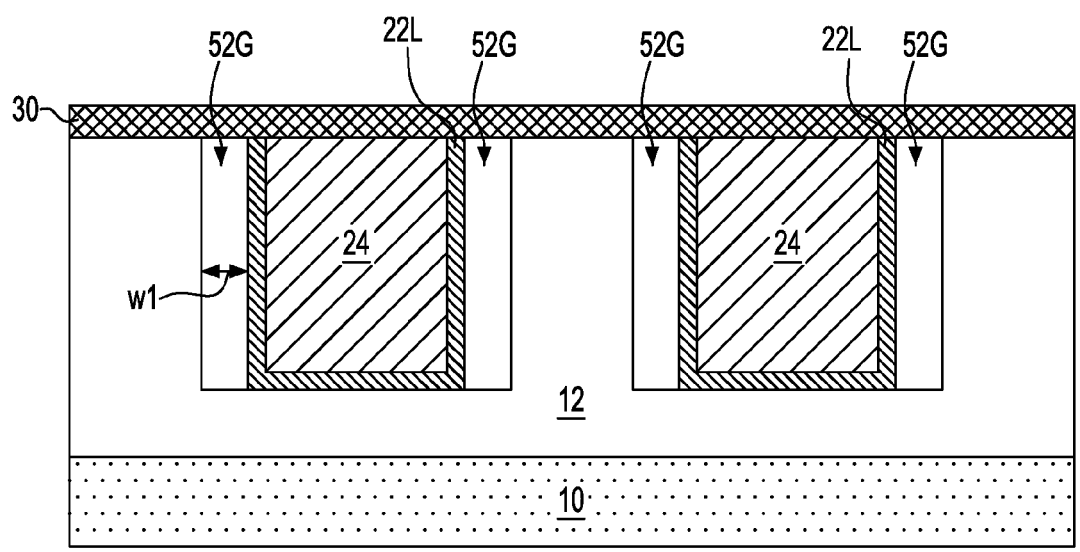
FIG. 19 is a cross sectional view of the exemplary semiconductor structure of FIG. 18 after forming an air gap cap layer that seals the air gap features and provides air gaps having the uniform shape.

Referring now to FIG. 19, there is illustrated the exemplary semiconductor structure of FIG. 18 after forming an air gap cap layer 30. The air gap cap layer of this embodiment is the same as the air gap cap layer mentioned above for FIG. 10. Thus, the description with regard to the air gap cap layer mentioned above in FIG. 10 applies equally well here for this embodiment of the present application Like the previous embodiments of the present application, each air gap 52G has a uniform shape. In one embodiment, each air gap 52G has a topmost surface that is coplanar with a topmost surface of the at least one interconnect metal or metal alloy structure 24, and each air gap 52G has a width, w1, from 1 nm to 80 nm.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   forming at least one opening into an interconnect dielectric material;
   forming a nitridized dielectric surface liner on each vertical surface of said interconnect dielectric material exposed by said at least one opening;
   forming a continuous metal layer on a topmost surface of said interconnect dielectric material and on a surface of said nitridized dielectric surface liner in said at least one opening;
   forming a metal nitride liner between said nitridized dielectric surface liner and said continuous metal layer in said at least one opening by performing an anneal;
   forming an interconnect metal or metal alloy structure in a remaining volume of said at least one opening, wherein each interconnect metal or metal alloy structure has a topmost surface that is coplanar with said topmost surface of said interconnect dielectric material;
   removing each metal nitride liner to provide a cavity; and
   widening a width of each cavity to provide an air gap feature having a uniform shape.

2. The method of claim 1, further comprising forming an air gap cap layer above said interconnect dielectric material, each air gap feature and each interconnect metal or metal alloy structure, wherein said air gap cap layer seals each air gap feature providing air gaps having said uniform shape.

3. The method of claim 1, further comprising forming a continuous diffusion barrier material on remaining portions of said metal layer after performing said anneal.

4. The method of claim 1, wherein said forming said interconnect metal or metal alloy structure comprises a planarization process, said planarization process removes portions of said continuous metal layer outside of said at least one opening, while maintaining a U-shaped metal layer in said at least one opening that consists of a remaining portion of said continuous metal layer.

5. The method of claim 4, wherein each vertical portion of said U-shaped metal layer is removed after forming said air gap features.

6. The method of claim 1, wherein said removing each of said metal nitride liners comprises a selective etching process.

7. The method of claim 1, wherein said widening said width of said cavity comprises a plasma etch and a wet removal process.

8. The method of claim 2, wherein each air gap has a width from 1 nm to 80 nm.

9. The method of claim 1, wherein said anneal facilitates an in-situ reaction between each of said nitridized dielectric surface liners and said continuous metal layer.

10. The method of claim 9, wherein each of said nitridized dielectric surface liners and said continuous metal layer are partially consumed during said anneal.

11. The method of claim 10, wherein said widening comprises removing remaining portions of each of said nitridized dielectric surface liners.

12. The method of claim 9, wherein each of said nitridized dielectric surface liners and said continuous metal layer in said at least one opening are completely consumed during said anneal.

13. The method of claim 12, wherein said widening comprises removing portions of said interconnect dielectric material.

14. The method of claim 1, wherein said metal nitride liners in said at least one opening are spaced apart from each other.

15. The method of claim 1, wherein a portion of said continuous metal liner is present along a physically exposed surface of the interconnect dielectric material at a bottom of said at least one opening.

* * * * *